(12) United States Patent
Argade et al.

(10) Patent No.: US 11,394,396 B2
(45) Date of Patent: Jul. 19, 2022

(54) LOSSLESS MACHINE LEARNING ACTIVATION VALUE COMPRESSION

(71) Applicant: Advanced Micro Devices, Inc., Santa Clara, CA (US)

(72) Inventors: Pramod Vasant Argade, San Diego, CA (US); Swapnil P. Sakharshete, San Diego, CA (US); Daniel N. Peroni, Bellevue, WA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 113 days.

(21) Appl. No.: 17/032,962

(22) Filed: Sep. 25, 2020

(65) Prior Publication Data

US 2022/0103183 A1 Mar. 31, 2022

(51) Int. Cl.
*H03M 7/24* (2006.01)
*G06N 20/00* (2019.01)

(52) U.S. Cl.
CPC .............. *H03M 7/24* (2013.01); *G06N 20/00* (2019.01)

(58) Field of Classification Search
CPC .................................. H03M 7/24; G06N 20/00
USPC ....................................................... 341/51–90
See application file for complete search history.

(56) References Cited

U.S. PATENT DOCUMENTS

| | | | | |
|---|---|---|---|---|
| 5,864,637 A * | 1/1999 | Liu | ....................... | H04N 19/132 382/250 |
| 6,232,894 B1 * | 5/2001 | Kawasaki | ............... | H03M 7/06 341/83 |
| 6,238,937 B1 * | 5/2001 | Toprac | ................. | C07K 14/195 257/E21.528 |
| 6,789,052 B1 * | 9/2004 | Toprac | .................... | H03M 7/30 703/2 |
| 7,586,424 B2 * | 9/2009 | Monro | .................... | H03M 7/24 708/203 |
| 10,305,980 B1 * | 5/2019 | Gonzalez | ................ | H03M 7/30 |
| 2007/0290898 A1 * | 12/2007 | Monro | .................... | H03M 7/40 341/51 |
| 2011/0099295 A1 * | 4/2011 | Wegener | ................. | H03M 7/46 711/170 |
| 2013/0262809 A1 * | 10/2013 | Wegener | ................. | H03M 7/24 711/E12.002 |
| 2014/0072027 A1 * | 3/2014 | Li | ........................ | H04N 19/436 375/E7.026 |
| 2019/0044531 A1 * | 2/2019 | Guilford | ................ | H03M 7/70 |

(Continued)

*Primary Examiner* — Lam T Mai
(74) *Attorney, Agent, or Firm* — Volpe Koenig (57) ABSTRACT

Techniques are disclosed for compressing data. The techniques include identifying, in data to be compressed, a first set of values, wherein the first set of values include a first number of two or more consecutive identical non-zero values; including, in compressed data, a first control value indicating the first number of non-zero values and a first data item corresponding to the consecutive identical non-zero values; identifying, in the data to be compressed, a second value having an exponent value included in a defined set of exponent values; including, in the compressed data, a second control value indicating the exponent value and a second data item corresponding to a portion of the second value other than the exponent value; and including, in the compressed data, a third control value indicating a third set of one or more consecutive zero values in the data to be compressed.

20 Claims, 5 Drawing Sheets

(56) References Cited

U.S. PATENT DOCUMENTS

| | | | |
|---|---|---|---|
| 2020/0090397 A1* | 3/2020 | Argade | A63F 13/25 |
| 2020/0184002 A1* | 6/2020 | Sakharshete | G06N 3/08 |

* cited by examiner

LOSSLESS MACHINE LEARNING ACTIVATION VALUE COMPRESSION

BACKGROUND

Machine learning operations involve computing and transmitting a large amount of data, which can place strain on computing resources. Improvements to computer resource usage for machine learning operations are constantly being made.

BRIEF DESCRIPTION OF THE DRAWINGS

A more detailed understanding can be had from the following description, given by way of example in conjunction with the accompanying drawings wherein.

DETAILED DESCRIPTION

Techniques are disclosed for compressing data. The techniques include identifying, in data to be compressed, a first set of values, wherein the first set of values include a first number of two or more consecutive identical non-zero values; including, in compressed data, a first control value indicating the first number of non-zero values and a first data item corresponding to the consecutive identical non-zero values; identifying, in the data to be compressed, a second value having an exponent value included in a defined set of exponent values; including, in the compressed data, a second control value indicating the exponent value and a second data item corresponding to a portion of the second value other than the exponent value; and including, in the compressed data, a third control value indicating a third set of one or more consecutive zero values in the data to be compressed.

Figure 1:
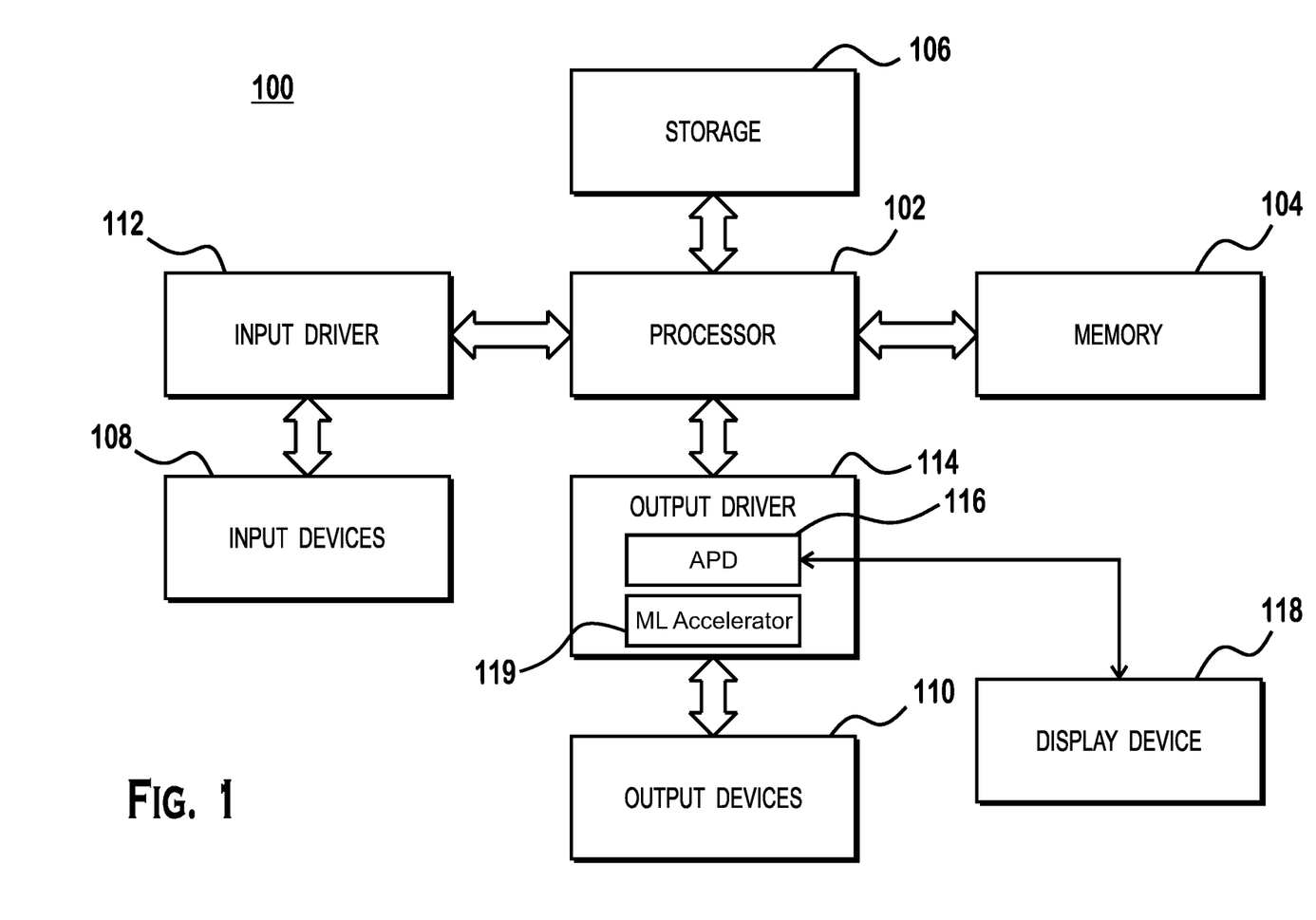
FIG. 1 is a block diagram of an example device in which one or more features of the disclosure can be implemented.

FIG. 1 is a block diagram of an example device 100 in which one or more features of the disclosure can be implemented. The device 100 could be one of, but is not limited to, for example, a computer, a gaming device, a handheld device, a set-top box, a television, a mobile phone, a tablet computer, or other computing device. The device 100 includes a processor 102, a memory 104, a storage 106, one or more input devices 108, and one or more output devices 110. The device 100 also includes one or more input drivers 112 and one or more output drivers 114. Any of the input drivers 112 are embodied as hardware, a combination of hardware and software, or software, and serve the purpose of controlling input devices 112 (e.g., controlling operation, receiving inputs from, and providing data to input drivers 112). Similarly, any of the output drivers 114 are embodied as hardware, a combination of hardware and software, or software, and serve the purpose of controlling output devices (e.g., controlling operation, receiving inputs from, and providing data to output drivers 114). It is understood that the device 100 can include additional components not shown in FIG. 1.

In various alternatives, the processor 102 includes a central processing unit (CPU), a graphics processing unit (GPU), a CPU and GPU located on the same die, or one or more processor cores, wherein each processor core can be a CPU or a GPU. In various alternatives, the memory 104 is located on the same die as the processor 102, or is located separately from the processor 102. The memory 104 includes a volatile or non-volatile memory, for example, random access memory (RAM), dynamic RAM, or a cache.

The storage 106 includes a fixed or removable storage, for example, without limitation, a hard disk drive, a solid state drive, an optical disk, or a flash drive. The input devices 108 include, without limitation, a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 include, without limitation, a display, a speaker, a printer, a haptic feedback device, one or more lights, an antenna, or a network connection (e.g., a wireless local area network card for transmission and/or reception of wireless IEEE 802 signals).

The input driver 112 and output driver 114 include one or more hardware, software, and/or firmware components that are configured to interface with and drive input devices 108 and output devices 110, respectively. The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. The output driver 114 includes an accelerated processing device ("APD") 116 which is coupled to a display device 118, which, in some examples, is a physical display device or a simulated device that uses a remote display protocol to show output. The APD 116 is configured to accept compute commands and graphics rendering commands from processor 102, to process those compute and graphics rendering commands, and to provide pixel output to display device 118 for display. As described in further detail below, the APD 116 includes one or more parallel processing units configured to perform computations in accordance with a single-instruction-multiple-data ("SIMD") paradigm. Thus, although various functionality is described herein as being performed by or in conjunction with the APD 116, in various alternatives, the functionality described as being performed by the APD 116 is additionally or alternatively performed by other computing devices having similar capabilities that are not driven by a host processor (e.g., processor 102) and configured to provide graphical output to a display device 118. For example, it is contemplated that any processing system that performs processing tasks in accordance with a SIMD paradigm may be configured to perform the functionality described herein. Alternative, the functionality described herein may be incorporated in the processor 102, an associated CPU and/or GPU, or any hardware accelerator, including a machine learning accelerator. Alternatively, it is contemplated that computing systems that do not perform processing tasks in accordance with a SIMD paradigm performs the functionality described herein.

The output driver 114 includes a machine learning (ML) accelerator 119. The ML accelerator includes processing components (such as circuitry and/or one or more processors that execute instructions) that perform machine learning operations. In some examples, machine learning operations include performing matrix multiplications or performing convolution operations.

Figure 2:
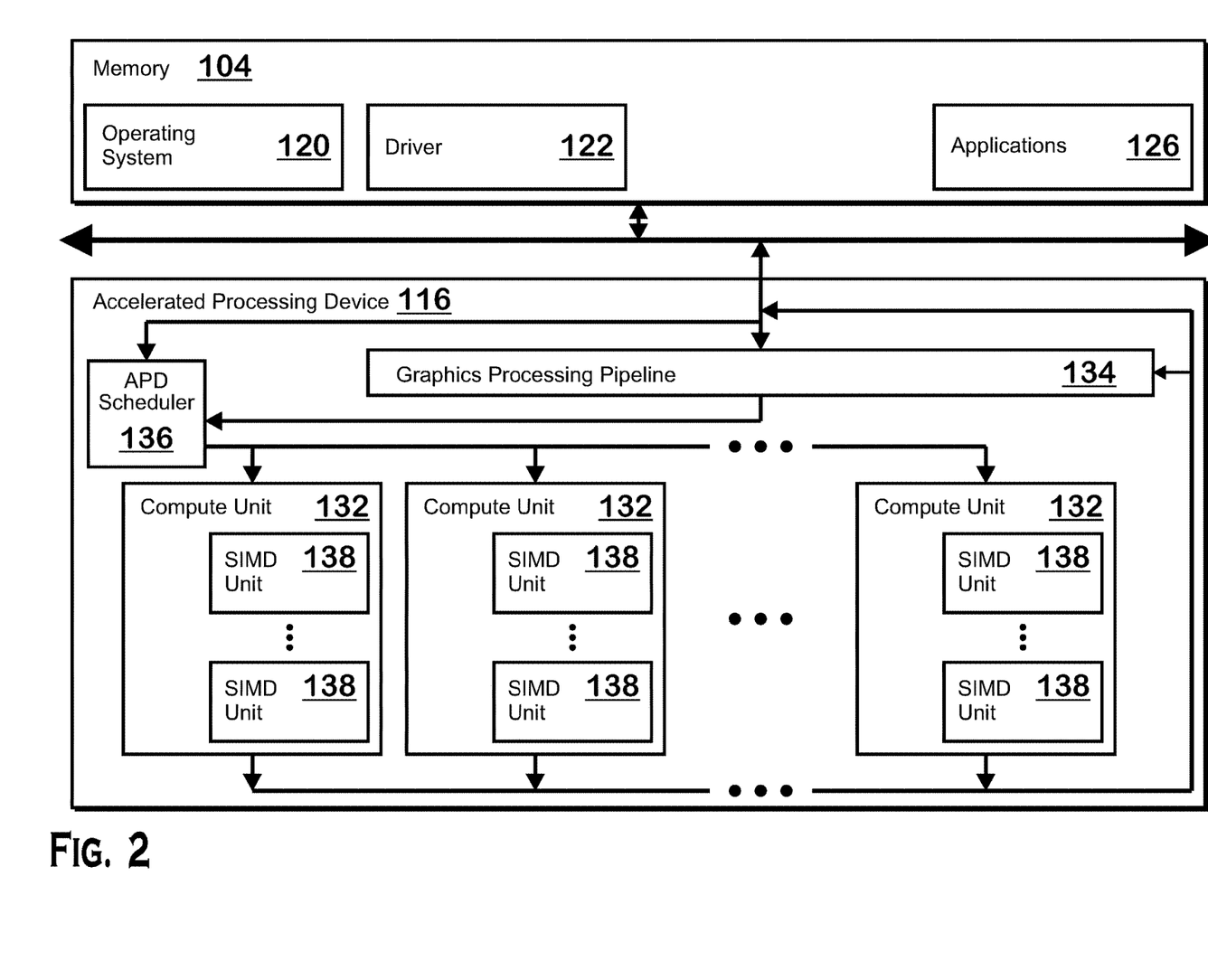
FIG. 2 illustrates details of the device 100 and the APD, according to an example.

FIG. 2 illustrates details of the device 100 and the APD 116, according to an example. The processor 102 (FIG. 1) executes an operating system 120, a driver 122, and applications 126, and may also execute other software alternatively or additionally. The operating system 120 controls various aspects of the device 100, such as managing hardware resources, processing service requests, scheduling and controlling process execution, and performing other operations. The APD driver 122 controls operation of the APD 116, sending tasks such as graphics rendering tasks or other work to the APD 116 for processing. The APD driver 122 also includes a just-in-time compiler that compiles programs for execution by processing components (such as the SIMD units 138 discussed in further detail below) of the APD 116.

The APD 116 executes commands and programs for selected functions, such as graphics operations and non-graphics operations that may be suited for parallel processing. The APD 116 can be used for executing graphics pipeline operations such as pixel operations, geometric computations, and rendering an image to display device 118 based on commands received from the processor 102. The APD 116 also executes compute processing operations that are not directly related to graphics operations, such as operations related to video, physics simulations, computational fluid dynamics, or other tasks, based on commands received from the processor 102. In some examples, these compute processing operations are performed by executing compute shaders on the SIMD units 138.

The APD 116 includes compute units 132 that include one or more SIMD units 138 that are configured to perform operations at the request of the processor 102 (or another unit) in a parallel manner according to a SIMD paradigm. The SIMD paradigm is one in which multiple processing elements share a single program control flow unit and program counter and thus execute the same program but are able to execute that program with different data. In one example, each SIMD unit 138 includes sixteen lanes, where each lane executes the same instruction at the same time as the other lanes in the SIMD unit 138 but can execute that instruction with different data. Lanes can be switched off with predication if not all lanes need to execute a given instruction. Predication can also be used to execute programs with divergent control flow. More specifically, for programs with conditional branches or other instructions where control flow is based on calculations performed by an individual lane, predication of lanes corresponding to control flow paths not currently being executed, and serial execution of different control flow paths allows for arbitrary control flow.

The basic unit of execution in compute units 132 is a work-item. Each work-item represents a single instantiation of a program that is to be executed in parallel in a particular lane. Work-items can be executed simultaneously (or partially simultaneously and partially sequentially) as a "wavefront" on a single SIMD processing unit 138. One or more wavefronts are included in a "work group," which includes a collection of work-items designated to execute the same program. A work group can be executed by executing each of the wavefronts that make up the work group. In alternatives, the wavefronts are executed on a single SIMD unit 138 or on different SIMD units 138. Wavefronts can be thought of as the largest collection of work-items that can be executed simultaneously (or pseudo-simultaneously) on a single SIMD unit 138. "Pseudo-simultaneous" execution occurs in the case of a wavefront that is larger than the number of lanes in a SIMD unit 138. In such a situation, wavefronts are executed over multiple cycles, with different collections of the work-items being executed in different cycles. An APD command processor 136 is configured to perform operations related to scheduling various workgroups and wavefronts on compute units 132 and SIMD units 138.

The parallelism afforded by the compute units 132 is suitable for graphics related operations such as pixel value calculations, vertex transformations, and other graphics operations. Thus in some instances, a graphics pipeline 134, which accepts graphics processing commands from the processor 102, provides computation tasks to the compute units 132 for execution in parallel.

The compute units 132 are also used to perform computation tasks not related to graphics or not performed as part of the "normal" operation of a graphics pipeline 134 (e.g., custom operations performed to supplement processing performed for operation of the graphics pipeline 134). An application 126 or other software executing on the processor 102 transmits programs that define such computation tasks to the APD 116 for execution.

The graphics processing pipeline 134 includes hardware that performs graphics rendering, in some implementations using the compute units 132 to perform tasks such as executing shader programs. In general, the graphics rendering operations include converting geometry specified in a three-dimensional word space into pixels of a screen space for display or other use. In various examples, the graphics processing pipeline 132 performs the operations of one or more of a vertex shader stage, which executes vertex shader programs on the compute units 132, a hull shader stage, which executes hull shader programs on the compute units 132, a domain shader stage, which executes domain shader programs on the compute units 132, a geometry shader stage, which executes geometry shader programs on the compute units 132, and a pixel shader stage, which executes pixel shader programs on the compute units 132. The APD 116 is also capable of performing compute shader programs, which are not included in the typical functionality of the graphics processing pipeline 134, on the compute units 132.

Figure 3:
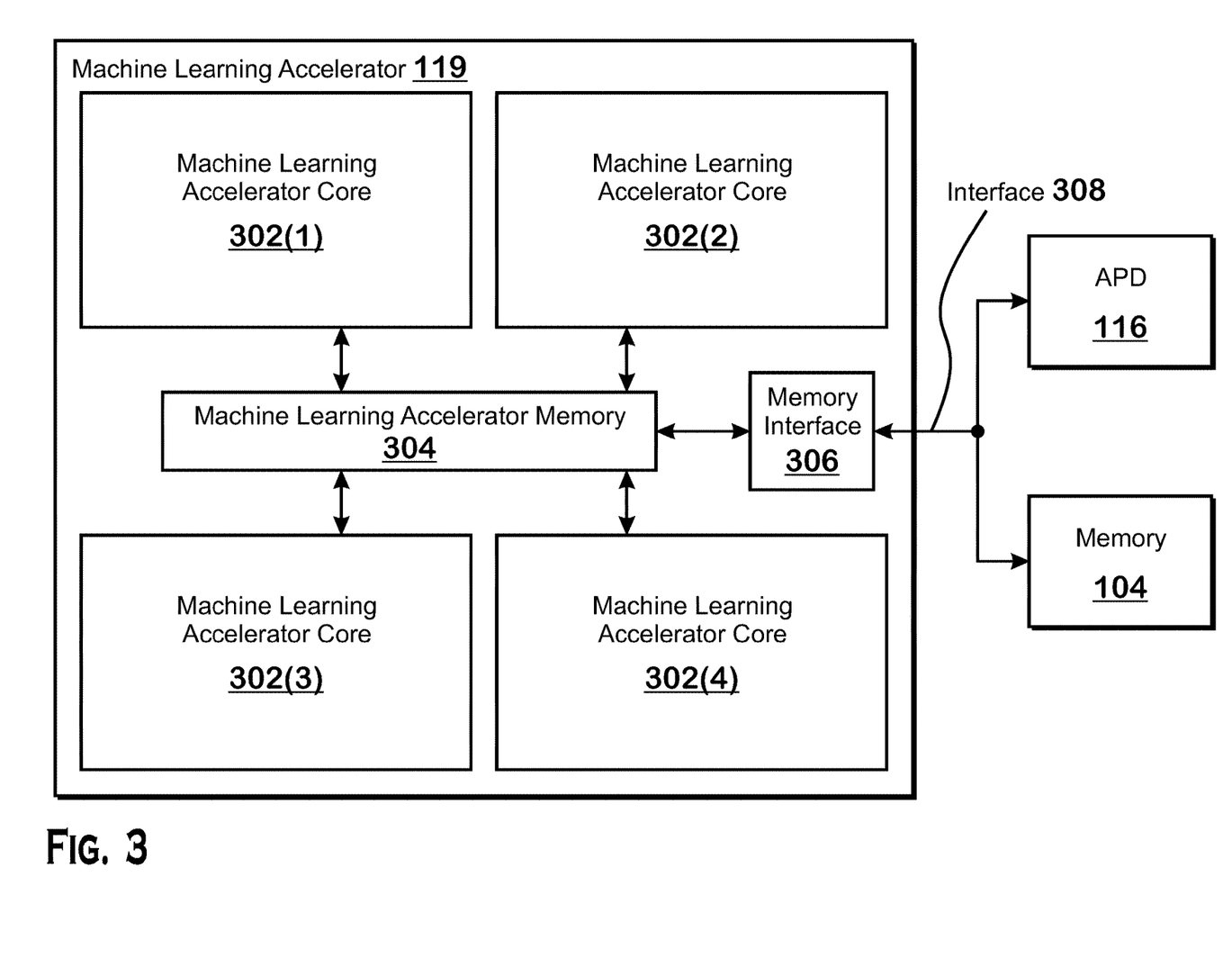
FIG. 3 is a block diagram illustrating additional details of a machine learning accelerator, according to an example.

FIG. 3 is a block diagram illustrating additional details of the machine learning accelerator ("ML accelerator") 119, according to an example. The ML accelerator 119 includes one or more machine learning accelerator cores 302. In some examples, the machine learning accelerator cores 302 include circuitry for performing matrix multiplications. The machine learning accelerator 119 also includes a machine learning accelerator memory 304 coupled to the machine learning accelerator cores 302 and a memory interface 306. The memory interface 306 communicably couples the machine learning accelerator memory 304 to external components such as the APD 116 and the memory 104.

The APD 116 and ML accelerator 119 implement machine learning operations including training and inference operations. Inference operations include applying inputs to a machine learning network and obtaining a network output such as a classification or other output. Training operations include applying training inputs to a machine learning network and modifying the weights of the network according to a training function.

As is generally known, a machine learning network includes a series of one or more layers. Each layer applies one or more operations such as a general matrix multiply, a convolution, a step function, or other operations, and provides an output. Some layer types implement operations that model artificial neurons. More specifically, some layer types implement operations in which inputs to the layer are provided to one or more artificial neurons. Each artificial neuron applies a weight to inputs, sums the weighted inputs, and, optionally, applies an activation function. The weighted sums of neuron inputs are implemented as matrix multiplications performed within the machine learning accelerator core 302. In another example, a layer implements convolutions. A convolution includes multiple instances of performing a dot product of a filter with a set of pixel values from an image. Because multiple of these dot products are performed, convolution operations are mapped to matrix multiplication operations on the machine learning accelerator cores 302. It should be understood that although matrix multiplication operations are generally described as being performed by the machine learning accelerator cores 302, in various alternative implementations, these cores 302 perform additional and/or alternative operations as well.

During training, a forward pass and a backwards pass are performed. The forwards pass processes network inputs to generate network outputs. The forwards pass involves generating outputs or "activation values" for different layers. In some examples, each activation value is the output of a single artificial neuron. The backwards pass involves applying weight adjustments to the various layers based on a correction function. The backwards pass also uses the activation values generated by the forward pass in adjusting these weights. More specifically, at each layer, the backwards pass attempts to determine an error of the actual activation values, and adjusts weights at that layer based on that error.

Due to the above, training using the ML accelerator 119 typically involves the machine learning accelerator 119 writing out a series of activation values to the memory 104 during the forward pass and reading those activation values back in from the memory 104 to the machine learning accelerator 119 during the backward pass. Because machine learning workloads include a large number of activation values, the system illustrated benefits from a compression scheme for the activation values. More specifically, the memory interface 306 implements a lossless compression scheme to compress the activation values written from the machine learning accelerator memory 304 to the memory 104 and then to decompress the compressed activation values upon being read from the memory 104 to the machine learning accelerator memory 304. The compression scheme achieves good compression ratio with lossless compression by exploiting features inherent in activation data.

In general, the compression scheme functions by representing individual activation values as a set including a control data element and compressed data. The control data element indicates the manner in which the compressed data is compressed. In some implementations, the compressed data is compressed according to one of the following schemes: exponent compression, repeating-value compression, zero-value compression, or the data is uncompressed. Exponent compression takes advantage of the fact that in activation data, there is typically a small subset of exponent values that are used very frequently. By encoding these values in the control data element, which is smaller than the size of the values encoded, the overall size of the control data element plus compressed data is smaller than the size of the raw data. Repeating-value compression takes advantage of the fact that activation values frequently include repeating values. Thus a control data element that indicates two or more repeating values reduces data usage as compared with including each of those multiple values. Zero-value compression takes advantage of the fact that activation data typically includes one or more zero values in sequence. If a control data element indicates one or more zeroes, then the entire activation value data is elided or omitted in the compressed data, which only includes the control data element for those one or more zeroes. In this situation, no activation value data is included for that corresponding compressed activation value data. In other words, the compressed activation value data is empty. In the case that the data does not fit into any of the above compression schemes, the control data element indicates that the data is not compressed and the compressed data includes the entire uncompressed activation value. In this situation, there is lower-than-one compression ratio—the stored data is larger than the uncompressed data because the stored data includes the control data element and the uncompressed data. However, the compression scheme is designed such that the prevalence of compression schemes among actual activation data is sufficient such that the overall compression of activation values in use has a greater-than-one compression ratio (the compressed data is smaller than the uncompressed data). Additional details follow.

Figure 4A:
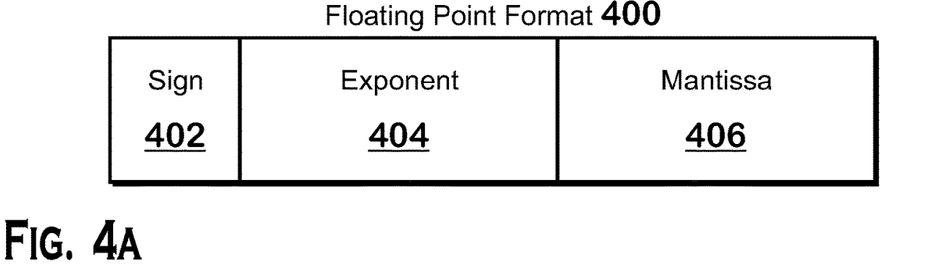
FIG. 4A illustrates an example floating point format.

FIG. 4A illustrates an example floating point format 400. The floating-point format 400 includes a sign 402, an exponent 404, and a mantissa 406. In some implementations, the sign 402 is a single bit that indicates whether the number is negative or positive. The exponent 404 includes data indicating the exponent (in base 2) that the mantissa 406 is raised to. In some implementations, the exponent 404 has an implicit bias, which is a fixed value added to the actual exponent 404 value. For example, in IEEE 754 single-precision binary floating-point format: binary 32, the offset value is −127. Although this particular floating-point format is described, the compression described herein applies to any format including an exponent value. In some implementations, for example IEEE 754, there is a hidden bit in the mantissa 406.

Figure 4B:
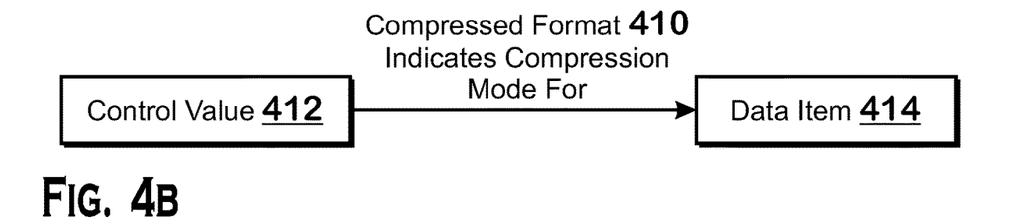
FIG. 4B illustrates a compressed format that represents compressed data for the floating-point format.

FIG. 4B illustrates a compressed format 410 that represents compressed data for the floating-point format 400. The compressed format 410 includes a control value 412 and a data item 414. Together, the control value 412 and data item 414 indicate one or more activation values in a floating-point format 400.

As described elsewhere herein, the control value 412 indicates one of: that the data item 414 represents repeating, identical activation values, that the uncompressed data includes one or multiple zeroes, that at least a portion of the exponent is a value included within a defined set of values, or that the data item 414 is uncompressed. A zero-valued activation value is an activation value that is 0 (i.e., the bits of the activation value indicate a floating-point value of plus or minus zero). While this example compression scheme is described for the activation values for machine learning, a similar compression scheme would be possible based on particular data patterns in floating point or integer values.

In the situation that the control value 412 indicates that the data item 414 represents repeating identical activation values, a single compressed format 410 element indicates multiple activation values in the floating-point format 400. More specifically, such a compressed format 410 element indicates that the uncompressed data includes multiple, repeating, consecutive identical activation values, and these activation values equal the data item 414.

In the situation that the control value 412 indicates that the uncompressed data includes one or multiple zeroes, a single compressed format 410 element indicates multiple activation values, all having the value of 0.

In the situation that the control value 412 indicates that at least a portion of the exponent is within a defined set of values, the control value 412 indicates which of the defined set of values the portion of the exponent has. The remainder of the floating-point format 400 value is indicated by the data item 414. Thus the entire floating-point format 400 value is the sign 402 and the portion of the exponent 404 represented by the control value 412 followed by the data item 414, which includes none or some of the exponent 404 and the mantissa 406. In an example, a defined set of values includes values 0xBD, 0xBE, 0xBF, and 0xC0, as well as 0x3D, 0x3E, 0x3F, and 0x40, where "0x" means the subsequent characters are hexadecimal digits. In such an example, the control value 412 is four bits long, meaning that eight bits of the floating-point format 410 element are represented by four bits of the control value 412. In some examples, the control value 412 also indicates the value of the sign 402 of the activation value.

The following table represents an example scheme for correspondence between control values 412 and data compression mode.

TABLE 1

Example control values-to-compression mode correspondence

| Control Value | Compression Mode |
|---|---|
| 0000 | Uncompressed |
| 0001 | Two consecutive repeating activation values |
| 0010 | Three consecutive repeating activation values |
| 0011 | Four consecutive repeating activation values |
| 0100 | Upper 8 bits are 0 × BD |
| 0101 | Upper 8 bits are 0 × BE |
| 0110 | Upper 8 bits are 0 × BF |
| 0111 | Upper 8 bits are 0 × C0 |
| 1000 | One zero activation value |
| 1001 | Two consecutive zero activation values |
| 1010 | Three consecutive zero activation values |
| 1011 | Four consecutive zero activation values |
| 1100 | Upper 8 bits are 0 × 3D |
| 1101 | Upper 8 bits are 0 × 3E |
| 1110 | Upper 8 bits are 0 × 3F |
| 1111 | Upper 8 bits are 0 × 40 |

In Table 1, the first control value of 0 represents that the data is uncompressed, in which case the corresponding data item 414 is the uncompressed activation value. The next three control values represent the compression mode of two, three, or four repeating values, in which case, the corresponding data item 414 is the repeated activation value. The next four control values and the last four control values represent that the upper 8 bits of the activation values have the values specified. In that case, the sign 402 and 7 bits of the exponent 404 have the specified value, while the data item 414 includes the remaining bits of the exponent 404 and the mantissa 406. The four control values 1000 through 1011 indicate that the compressed one through four activation values have a value of 0. In that case, there is no corresponding data item 414.

Figure 4C:
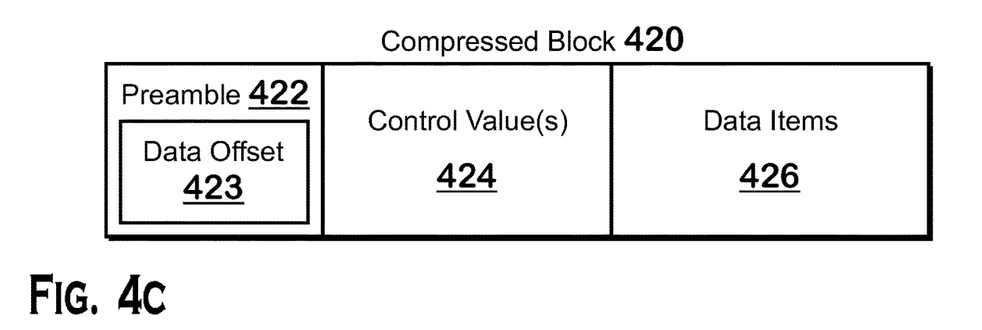
FIG. 4C illustrates an example compressed block.

FIG. 4C illustrates an example compressed block 420. The compressed block 420 is a unit of compressed data that corresponds to one or more activation values. Compressed block 420 corresponds to a fixed size of uncompressed data of predetermined size. Preamble 422 contains a data offset field 423 which indicates the byte address offset within the compressed data block 420 where the data items 426 start. Preamble 422 is of fixed length and control values immediately follow the preamble. In some examples, the compressed block 420 is 128 bytes long, although the compressed block 420 can have any size.

The compressed block 420 includes a preamble 422. The preamble 422 includes a data offset 423. The compressed block 420 also includes a set of control values 424 (which includes one or more control values 412) and a set of data items 426 (which includes one or more data items 414). Since the control values 424 for multiple compressed activation values are consecutive, the data offset 423 is used to indicate the position of the beginning of the data items 426 in the compressed block 420. For example, in some implementations, the data offset 423 indicates the location of the data items 426 from the beginning of the compressed block 420.

The control values 424 are one or more control values 412 for one or more different compressed activation values, arrayed consecutively. Note that the control values 424 are all the same size, but there can be different numbers of control values 424 for each compressed block 420 depending on the actual compression modes used for the data items 426. The data items 414 are also arrayed consecutively in the data items 426 portion of the compressed block 420.

The order of the control values 412 in the control value portion 424 is the same as the order of the corresponding data items 414 in the data items portion 426. Thus a first control value 412 in the control values 424 portion corresponds to a first data item 414 in the data items portion 426. A second control value 412 corresponds to a second data item 414 in the data items portion 426, and so on. Note, however, that if a control value 412 indicates one or more zero-valued activation values, then there is no corresponding data item 414 in the data items 426 portion of the compressed block 420. Thus it is possible for a control value 412 in a certain position (for example, the second control value 412) to be associated with a data item 414 in a different position (for example, a first data item 414, in the case that the first control value 412 indicates that a corresponding one or more activation values has a value of 0). This differing in position occurs in the instance that one or more previous control value 412 indicates that the corresponding activation value has a value of 0, and results in a shifted position correspondence equal to the number of such control values 412. For example, if four control values prior to a particular control value 414 in the control values 424 portion indicate that the corresponding activation values are 0, then the data items 426 are shifted over by four. In an extreme example, all control values 412 in a block indicate that the corresponding activation values are zero, in which case, there are no data items 414. Similarly, if a control value 412 indicates the repeated identical activation value, then there is only one activation value in the data item 426.

Figure 5:
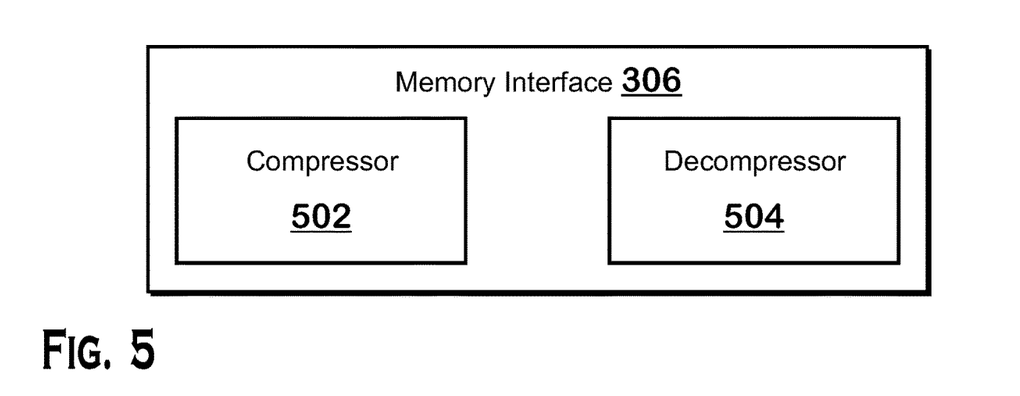
FIG. 5 illustrates details of the memory interface, according to an example.

FIG. 5 illustrates details of the memory interface 306, according to an example. As described elsewhere, and referring back to FIG. 3, the memory interface 306 compresses activation data of the machine learning accelerator memory 304 for output and storage in the memory 104. The memory interface 306 includes a compressor 502 to perform this compression and a decompressor 504 to perform the decompression.

The compressor 502 examines incoming uncompressed data of a given size to determine how to compress the data. The compressor 502 proceeds through the activation values, storing control values 412 and data items 414 into a compressed block 420 until the incoming data block has been processed for compression. As the compressor 502 progresses through the activation values, the compressor 502 determines which control value 412 to apply to currently considered one or more activation values. After determining a control value 412 for currently considered one or more activation values, the compressor 502 adds the control value 412 to the control values 424 in the proper place and adds the corresponding data items 414, if any, to the data items 426 portion in the proper place.

The compressor 502 determines a control value 412 for a currently considered one or more activation values in the following manner. The compressor 502 searches for a sequence of identical two or more activation values (up to the maximum number that can be represented by a single control value 424—in the example above, 4). If the compressor 502 finds such a sequence, then the compressor 502 records the appropriate control value 412 in the control values 424. If the identical activation values are 0, then the compressor 502 records no data item in the data items 426 and if the identical activation values are non-zero, then the compressor 502 records one instance of that activation value as the corresponding data item 414 in the data items 426.

If the compressor 502 does not find two or more repeating values starting from the currently considered activation values, then the compressor 502 checks whether the exponent-compression scheme applies. More specifically, the compressor 502 determines whether the bits represented by any of the exponent-compression control values match the corresponding bits (e.g., first eight bits) of the activation value. If a match occurs, then the compressor 502 records the control value 412 corresponding to the matched value in the control values 424 and records the remainder of the activation value (i.e., subsequent to and not inclusive of the matched value) in the data items 426. If a match does not occur, then the compressor 502 records an "uncompressed" control value 412 in the control values 424 and records the full activation value in the data items 426. The compressor 502 determines the location of the beginning of the data items 426 based on the number and size of the control values 412 in the control values 424 and records that location as the offset 423. In general, this offset is determined when it is known how many control values 412 belong in the control value 424 portion, based on the ways in which the activation values are compressed.

To decompress a compressed block 420, the decompressor 504 reads the data offset 423 to determine the location of the first data item 414 in the data items 426. The decompressor 504 also reads each control value 412 in sequence and applies the control value to expand the corresponding data items 414 or to introduce zero-values into the uncompressed data. In the case that the decompressor 504 encounters an exponent-compression control value 412, the decompressor 504 generates an activation value having the bits corresponding to the control value followed by the corresponding data item. In the case that the decompressor 504 encounters a control value 412 indicating a repeating set of values, the decompressor 504 generates either a repeating set of corresponding data items 414 or zero values, based on the control value 412. In the case that the decompressor 504 encounters a control value 412 indicating no compression, the decompressor 504 reads the corresponding data item 414 and outputs that data item 414 as the activation value.

Although the compressor 502 and decompressor 504 are described as being part of a memory interface used to store machine learning activations in a memory 104, the compressor 502 and decompressor 504 are, in alternative implementations, included at any location and/or within any other device, and perform compression and decompression for values other than activation values.

Figure 6:
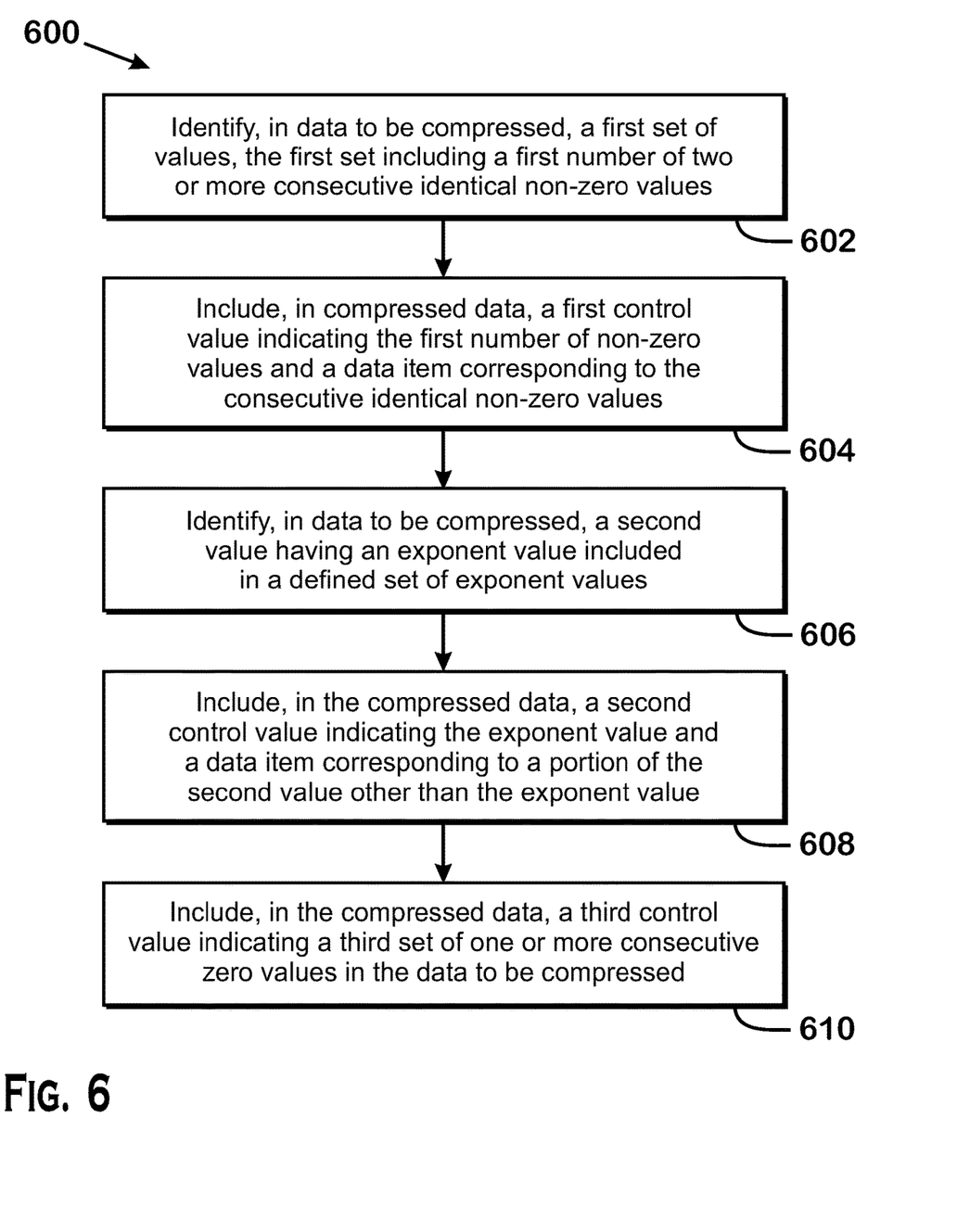
FIG. 6 is a flow diagram of a method for compressing data, according to an example.

FIG. 6 is a flow diagram of a method 600 for compressing data, according to an example. Although described with respect to the system of FIGS. 1-5, those of skill in the art will understand that any system that performs the steps of the method 600 in any technically feasible order falls within the scope of the present disclosure.

At step 602, a compressor 502 identifies, in data to be compressed, a first set of values. The first set of values includes a first number of two or more consecutive identical non-zero values. As described elsewhere herein, such values can be compressed with a control value indicating repetition and a data item indicating the data repeated. Thus, at step 604, the compressor 502 includes, in compressed data, a first control value indicating the first number of non-zero values and a data item corresponding to the consecutive identical non-zero values. In some examples, the data item is equal to the value that repeats. Thus, the repeating values is compressed by reducing the number of instances of including such values to one.

At step 606, the compressor 502 identifies, in the data to be compressed, a second value having an exponent value that is included in a defined set of exponent values. In some examples, this "exponent value" is a portion of the actual exponent value of the data to be compressed. In some examples, this exponent value includes a sign bit. In some examples, the length of the exponent value, including the sign bit, is 8 bits. In some examples, the exponent value is the upper 8 bits of the value to be compressed.

At step 608, the compressor 502 includes, within the compressed data, a second control value. The second control value indicates the exponent value, as well as the fact that a corresponding data item has the remaining portion of the compressed value. In other words, the second control value indicates that the value to be compressed is compressed by representing at least a portion of the exponent value by a value represented by the control value 412. The compressor 502 also includes, in the compressed data, the remainder of the data to be compressed, in excess of the portion of the exponent value represented by the control value 412. In some examples, the value represented by the control value 412 also includes the sign 402 of the value to be compressed. In an example, the first eight bits of the value to be compressed includes a sign bit and the upper 7 bits of the exponent. The control value 412, which is 4 bits, indicates the 8 bits including the sign bit and the upper 7 bits of the exponent.

At step 610, the compressor 502 includes, in the compressed data, a third control value indicating a third set of one or more consecutive zero values in the data to be compressed. That is, because the data to be compressed has one or more consecutive values that are zero, this data can be represented as a control value that indicates one or more consecutive zero values. In this instance, because it is known that the corresponding value is zero, the compressor 502 does not store any data item 414 corresponding to the compressed value.

In some examples, the compressor 502 repeats the method 600 for a single compressed block 420 until the input block of a given size has been completely processed. In some examples, the compressor 502 begins a new compressed block 420 at that point. In some examples, the size of the values that are being compressed is the same for each value compressed into a single compressed block 420. In some examples, the size of the control value 412 (e.g., 4 bits) is sufficient to represent all possible control values, and no more. For example, in the example control values described in Table 1, in which there are 16 possible control values, the size of the control value 412 is four bits ($2^4=16$). In some examples, the exponent values of the predefined set of exponent values for the exponent-compression mode are configurable, such as by setting values in one or more configuration registers. In other words, in some examples, the exponent values that the compressor 502 attempts to match to the data being compressed are configurable.

Although it has been described that the compressed used herein is useful to reduce bandwidth utilization, the compression described herein is also useful for power reduction for the situation where fixed size blocks are accessed. In an example, the machine learning accelerator 119 is capable of reading or writing with an uncompressed block size granularity (for example, 128 bytes). In this example, the transmission burst size is smaller than this uncompressed block size (for example, 32 bytes). In this example, if the compressed data for the uncompressed block is accessed, and the corresponding compressed data is reduced in size by half, than only 2, rather than 4, bursts are needed for transmission, which reduces power utilization.

Each of the units illustrated in the figures represents one or more of hardware configured to perform the described operations, software executable on a processor, wherein the software is configured to perform the described operations, or a combination of software and hardware. In an example, the storage 106, memory 104, processor 102, display device 18, output driver 114, APD 116, ML accelerator 119, output devices 110, input driver 112, and input devices 108, are all hardware circuitry that perform the functionality described herein. In an example, all elements of the APD 116 are hardware circuitry that perform the functions described herein. In various examples, the elements of the ML accelerator 119, including the machine learning accelerator core 302, the machine learning accelerator memory 304, and the memory interface 306 are hardware circuitry that perform the functions described herein.

It should be understood that many variations are possible based on the disclosure herein. Although features and elements are described above in particular combinations, each feature or element can be used alone without the other features and elements or in various combinations with or without other features and elements.

The methods provided can be implemented in a general purpose computer, a processor, or a processor core. Suitable processors include, by way of example, a general purpose processor, a special purpose processor, a conventional processor, a graphics processor, a machine learning processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements features of the disclosure.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method for compressing data, the method comprising:
   identifying, in data to be compressed, a first set of values, wherein the first set of values include a first number of two or more consecutive identical non-zero values;
   including, in compressed data, a first control value indicating the first number of non-zero values and a first data item corresponding to the consecutive identical non-zero values;
   identifying, in the data to be compressed, a second value having an exponent value included in a defined set of exponent values;
   including, in the compressed data, a second control value indicating the exponent value and a second data item corresponding to a portion of the second value other than the exponent value; and
   including, in the compressed data, a third control value indicating a third set of one or more consecutive zero values in the data to be compressed.

2. The method of claim 1, further comprising:
   including, in the compressed data, a fourth control value indicating a value for which compression does not occur; and
   including, in the compressed data, the value, as a third data item.

3. The method of claim 1, further comprising:
   decompressing the compressed data by expanding data items of the compressed data according to control values of the compressed data.

4. The method of claim 3, wherein expanding the data items includes duplicating one or more data items stored as repeating items, and adding a full exponent value for data items stored as exponent-compressed.

5. The method of claim 1, further comprising:
   including, within a consecutive control values portion of a compressed block, the first control value, the second control value, and the second value.

6. The method of claim 1, further comprising:
   including, within a consecutive data items portion of a compressed block, the first data item and the second data item.

7. The method of claim 1, further comprising:
   adding data for one or more values for compression until an input uncompressed block is completely processed.

8. The method of claim 1, further comprising:
   adding, into a compressed block, a data offset indicating a position of a data items portion as an offset from a beginning of the compressed block.

9. The method of claim 1, further comprising:
   modifying at least one value of the defined set of exponent values.

10. A memory device, comprising:
    a memory; and
    a memory interface, configured to:
    identify, in data to be compressed, a first set of values, wherein the first set of values include a first number of two or more consecutive identical non-zero values;
    include, in compressed data, a first control value indicating the first number of non-zero values and a first data item corresponding to the consecutive identical non-zero values;

identify, in the data to be compressed, a second value having an exponent value included in a defined set of exponent values;

include, in the compressed data, a second control value indicating the exponent value and a second data item corresponding to a portion of the second value other than the exponent value; and include, in the compressed data, a third control value indicating a third set of one or more consecutive zero values in the data to be compressed.

11. The memory device of claim 10, wherein the memory interface is further configured to:

include, in the compressed data, a fourth control value indicating a value for which compression does not occur; and include, in the compressed data, the value, as a third data item.

12. The memory device of claim 10, wherein the memory interface is further configured to:

decompress the compressed data by expanding data items of the compressed data according to control values of the compressed data.

13. The memory device of claim 12, wherein expanding the data items includes duplicating one or more data items stored as repeating items, and adding a full exponent value for data items stored as exponent-compressed.

14. The memory device of claim 10, wherein the memory interface is further configured to:

including, within a consecutive control values portion of a compressed block, the first control value, the second control value, and the second value.

15. The memory device of claim 10, wherein the memory interface is further configured to:

include, within a consecutive data items portion of a compressed block, the first data item and the second data item.

16. The memory device of claim 10, wherein the memory interface is further configured to:

add data for one or more values for compression until an input uncompressed block is completely processed.

17. The memory device of claim 10, wherein the memory interface is further configured to:

adding, into a compressed block, a data offset indicating a position of a data items portion as an offset from a beginning of the compressed block.

18. The memory device of claim 10, wherein the memory interface is further configured to:

modify at least one value of the defined set of exponent values.

19. A non-transitory computer-readable medium storing instructions that, when executed by a processor, cause the processor to:

identify, in data to be compressed, a first set of values, wherein the first set of values include a first number of two or more consecutive identical non-zero values;

include, in compressed data, a first control value indicating the first number of non-zero values and a first data item corresponding to the consecutive identical non-zero values;

identify, in the data to be compressed, a second value having an exponent value included in a defined set of exponent values;

include, in the compressed data, a second control value indicating the exponent value and a second data item corresponding to a portion of the second value other than the exponent value; and include, in the compressed data, a third control value indicating a third set of one or more consecutive zero values in the data to be compressed.

20. The non-transitory computer-readable medium of claim 19, wherein the memory interface is further configured to:

include, in the compressed data, a fourth control value indicating a value for which compression does not occur; and include, in the compressed data, the value, as a third data item.

* * * * *